(12) United States Patent
Takahashi

(10) Patent No.: US 6,703,335 B2
(45) Date of Patent: Mar. 9, 2004

(54) DIELECTRIC CERAMIC COMPOSITION AND METHOD FOR DESIGNING DIELECTRIC CERAMIC COMPOSITION

(75) Inventor: Takeshi Takahashi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/383,557

(22) Filed: Mar. 10, 2003

(65) Prior Publication Data

US 2003/0148872 A1 Aug. 7, 2003

Related U.S. Application Data

(62) Division of application No. 09/705,817, filed on Nov. 6, 2000, now Pat. No. 6,566,291.

(30) Foreign Application Priority Data

May 22, 2000 (JP) ........................................ 2000-149551

(51) Int. Cl.$^7$ ............................................. C04B 35/495
(52) U.S. Cl. ...................................... 501/134; 501/135
(58) Field of Search ................................. 501/134, 135, 501/136, 137, 138, 139

(56) References Cited

U.S. PATENT DOCUMENTS

| | | | |
|---|---|---|---|
| 4,485,180 A | 11/1984 | Konoike et al. | |
| 4,487,842 A | 12/1984 | Nomura et al. | |
| 4,548,910 A | 10/1985 | Irisawa | |
| 4,968,649 A | 11/1990 | Tsurumi et al. | |
| 5,057,466 A | 10/1991 | Sugiyama et al. | |
| 5,246,898 A | 9/1993 | Fujimaru et al. | |
| 5,457,076 A | 10/1995 | Katagiri et al. | |
| 6,087,286 A | 7/2000 | Ikeda et al. | 501/135 |
| 6,117,806 A | 9/2000 | Yokoi et al. | |
| 6,231,779 B1 | 5/2001 | Chiang et al. | |

FOREIGN PATENT DOCUMENTS

| | | |
|---|---|---|
| JP | 1-124272 | 5/1989 |
| JP | 5-5778 | 1/1993 |
| JP | 7-84347 | 9/1995 |
| JP | 2977707 | 9/1999 |

OTHER PUBLICATIONS

K. Sasazawa et al., "High–Q Dielectric Resonator Sintered at Low Firing Temperature," Japanese Journal of Applied Physics., vol. 24, Supplement 24–2, (1985), pp. 1022–1024.

Hiroshi Tamura et al., "Improved High–Q Dielectric Resonator with Complex Perovskite Structure," Communications of the American Ceramic Society, Apr. 1984, pp. C–59–C–61.

Shoichiro Nomura, "Ceramics for Microwave Dielectric Resonator," Ferroelectrics. vol. 49, 1983, pp. 61–70.

Shoichiro Nomura et al., "Ba(Mn1/3Ta2/3)O3 Ceramic with Ultra–Low Loss at Microwave Frequency," Japanese J. Appl. Phys. vol. 23, No. 4, (1984), pp. 507–508.

In Rae Kim et al., "Ordering and Microwave Dielectric Properties of Ba(Ni1/3Nb2/3)O3 Ceramics," J. Mater. Res., vol. 12, No. 2, Materials Research Society, Feb. 1997, pp. 518–525.

Takeshi Takahashi et al., "First–Principles Investigation of B–Site Ordering in BA(MgxTa1–x)O3 Microwave Dielectrics with the Complex Perovskite Structure," Japan J. Appl. Phys., vol. 39, Part 1, No. 3A, Mar. 2000, pp. 1241–1248.

B.P. Burton, "Empirical Cluster Expansion Models of Cation Order–Disorder in A(B'1/3, b"2/3)O3 Perovskites," Physical Review B., vol. 59, No. 9, Mar. 1, 1999, pp. 6087–6091.

*Primary Examiner*—Karl Group
(74) *Attorney, Agent, or Firm*—Oblon, Spivak, McClelland, Maier & Neustadt, P.C.

(57) ABSTRACT

The present invention provides a dielectric ceramic composition suitable for achieving a high Q-factor in a high-frequency range and a design method for newly developing such a dielectric ceramic composition. A dielectric ceramic composition is formed primarily from a complex perovskite dielectric ceramic composition $A^{2+}(B'^{2+}_{1/3}B''^{5+}_{2/3})O^{2-}_3$ and has a hexagonal triple superlattice structure, wherein a difference between the lattice energy $E_{ORD}$ per unit atom of the hexagonal triple superlattice structure which is formed in a case where $B'^{2+}$ ions and $B''^{5+}$ ions are ordered in the 1:2 B-site sequence and the lattice energy $E_{DIS}$ per unit atom of a simple perovskite structure formed when the B-site of the complex perovskite dielectric ceramic composition has a disordered configuration or that of a model structure approximated to a disordered configuration; that is, $\Delta E_{DIS-ORD}$, satisfies the following equation $$\Delta E_{DIS-ORD} = E_{DIS} - E_{ORD} \geq 77.8 (meV/\text{atom}).$$

18 Claims, 2 Drawing Sheets

- ■ : EXAMPLES OF THE INVENTION
- ○ : EXAMPLES DESIGNED BY THE INVENTION
- × : COMPARATIVE EXAMPLES

DIELECTRIC CERAMIC COMPOSITION AND METHOD FOR DESIGNING DIELECTRIC CERAMIC COMPOSITION

This application is a Division of application Ser. No. 09/705,817 Filed on Nov. 6, 2000, now U.S. Pat. No. 6,566,291.

BACKGROUND OF THE INVENTION

1. Field of the Invention

The present invention primarily relates to a dielectric ceramic composition used in a high frequency range including, for example, pseudo-microwaves, microwaves, millimeter waves, and sub-millimeter waves. Preferably, the present invention is applied to, for example, a high frequency dielectric ceramic composition constituting resonators, oscillators, filters, and circuit boards in satellite communication equipment, mobile communication equipment, wireless communication equipment, RF communication equipment, and their base stations.

2. Description of the Background Art

It is well known that high-frequency dielectric ceramic compositions are generally used in high-frequency devices, such as resonators, oscillators, and filters for current high-frequency communications operated fairly in the pseudo-microwave or microwave regime. In general, the high-frequency dielectric ceramic composition is desired to have a high dielectric constant ($\in_r$), a near-zero temperature coefficient of resonant frequency ($\tau_f$), and a high Q-factor.

BaO—$TiO_2$—$SnO_2$-based materials described in U.S. Pat. No. 4,548,910 (1985) and BaO—$TiO_2$—$Nd_2O_3$—$Bi_2O_3$—$Nb_2O_3$—MnO-based materials described in Japanese Patent No. 2977707 (1999) have conventionally been used as a typical high-frequency dielectric ceramic composition. A dielectric ceramic composition with the complex perovskite structure is known as a material having a higher Q-factor in the high frequency range.

Recently, demands for high-speed communication or an increase in the number of communication channels causes requirements of higher operation frequency for communication. Because of these increase in frequency bands, development of a dielectric ceramic composition having a higher Q-factor has been become more important. However, conventional high-frequency dielectric ceramic compositions have not possessed practical Q-factors in the millimeter band or the sub-millimeter band. High power consumption caused by a low Q-factor of a conventional high-frequency dielectric ceramic composition leads to the short operating time of a battery. Thus, power savings in electronic components or portable terminals have been hindered. Most of dielectric ceramic compositions have such a characteristic that the product of frequency (f) and Q-factor (Q), that is, Qf is a constant value. An increase of an operation frequency, therefore, causes a decrease of Q-factor.

Even if a new development of a dielectric ceramic composition having a high Q-factor is attempt in order to solve the above-described problem, there are no means to investigate which dielectric ceramic composition has the potential to attain a high Q-factor. Since there exist no guidelines or principles for developing a new dielectric ceramic composition, there has been no alternative but to experimentally try combinations of various elements. In this process, enormous amounts of development time and costs have been wasted.

The following dielectric ceramic compositions have already been developed; namely, $Ba(Co_{1/3}Nb_{2/3})O_3$-based materials (Qf of 60000 GHz) described in Japanese Journal of Applied Physics Vol. 24, 1985; $Ba(Co_{1/3}Ta_{2/3})O_3$-based materials (Qf of 46200 GHz) and $Ba(Ni_{1/3}Ta_{2/3})O_3$-based materials (Qf of 49700 GHz) described in Journal of American Ceramic Society Vol. 66, 1983; $Ba(Mg_{1/3}Nb_{2/3})O_3$-based materials (Qf of 55400 GHz), $Ba(Mn_{1/3}Nb_{2/3})O_3$-based materials (Qf of 900 GHz), and $Ba(Zn_{1/3}Nb_{2/3})O_3$-based materials (Qf of 86900 GHz) described in Ferroelectrics Vol. 49, 1983; $Ba(Mg_{1/3}Ta_{2/3})O_3$-based materials (Qf of 200000 GHz) described in Examined Japanese Patent Publication No. 7-84347/(1995); $Ba(Mn_{1/3}Ta_{2/3})O_3$-based materials (Qf of 109200 GHz) described in Japanese Journal of Applied Physics Vol. 23, 1984; $Ba(Ni_{1/3}Nb_{2/3})O_3$-based materials (Qf of 480000 GHz) described in Journal of Material Research Vol. 12, 1997; and $Ba(Zn_{1/3}Ta_{2/3})O_3$-based materials (Qf of 169200 GHz) described in Examined Japanese Patent Publication No. 7-5778/(1993). For the purpose of comparison, example dielectric characteristics of the known high-frequency dielectric ceramic compositions are summarized in Table 1.

TABLE 1

| COMPOSITION | $\in_r$ | Qf(GHz) | $\tau_f$(ppm/° C.) |
| --- | --- | --- | --- |
| $Ba(Co_{1/3}Nb_{2/3})O_3$ | 31 | 60000 | −6 |
| $Ba(Co_{1/3}Ta_{2/3})O_3$ | 25 | 46200 | −16 |
| $Ba(Mg_{1/3}Nb_{2/3})O_3$ | 32 | 55400 | 33 |
| $Ba(Mg_{1/3}Ta_{2/3})O_3$ | 24 | 200000 | 4 |
| $Ba(Mn_{1/3}Nb_{2/3})O_3$ | 39 | 900 | 27 |
| $Ba(Mn_{1/3}Ta_{2/3})O_3$ | 28 | 109200 | 40 |
| $Ba(Ni_{1/3}Nb_{2/3})O_3$ | 31 | 48000 | −18 |
| $Ba(Ni_{1/3}Ta_{2/3})O_3$ | 23 | 49700 | −18 |
| $Ba(Zn_{1/3}Nb_{2/3})O_3$ | 41 | 86900 | 31 |
| $Ba(Zn_{1/3}Ta_{2/3})O_3$ | 30 | 168000 | 0 |

These materials have embodied a composition having a maximum Qf of about 200000 GHz. Improvements have been made only in terms of impurities to be mixed or contained with the materials and manufacturing methods. No attempt has been succeeded to manifest the atomic coordinate structure of a high-frequency dielectric ceramic composition crystal or the correlation between atomic coordinate structure and Qf.

SUMMARY OF THE INVENTION

The present invention is aimed at solving the foregoing problems and providing a dielectric ceramic composition suitable for achieving a high Q-factor in a high-frequency range. Further, the present invention is aimed at providing a method of designing a dielectric ceramic composition which enables short-term, and inexpensive development of a new dielectric ceramic composition which will possess a high Q-factor in a high frequency range.

To this end, the present invention provides a dielectric ceramic composition formed primarily from a complex perovskite dielectric ceramic composition $A^{2+}(B'^{2+}_{1/3}B''^{5+}_{2/3})O^{2-}_3$ and having a hexagonal triple superlattice structure, wherein a difference between the lattice energy $E_{ORD}$ per unit atom of the hexagonal triple superlattice structure which is formed in a case where $B'^{2+}$ ions and $B''^{5+}$ ions are ordered in the 1:2 B-site sequence and the lattice energy $E_{DIS}$ per unit atom of a simple perovskite structure formed when the B-site of the complex perovskite dielectric ceramic composition has a disordered configuration or that of a model structure approximated to a disordered configuration; that is, $\Delta E_{DIS-ORD}$, satisfies the following equation $$\Delta E_{DIS-ORD} = E_{DIS} - E_{ORD} \geq 77.8 (meV/\text{atom}) \tag{1}.$$

Further, the present invention provides a method of designing a dielectric ceramic composition comprising the steps of: optimizing the crystal structure of the dielectric ceramic composition such that the lattice energy of a crystal structure having an ordered configuration is minimized;

optimizing the crystal structure of the dielectric ceramic composition such that the lattice energy of a disordered crystal structure or the lattice energy of a model structure approximated to the disordered configuration is minimized; and determining an absolute value of a difference between lattice energy $E_{ORD}$ per unit atom of the thus-optimized ordered crystal structure and lattice energy $E_{DIS}$ per unit atom of the thus-optimized disordered structure or the thus-optimized model structure approximated to the disordered configuration; that is, $|\Delta E_{DIS-ORD}|$, to thereby estimate Q-factor of a dielectric ceramic composition and design a dielectric ceramic composition having a high Q-factor.

Preferably, the dielectric ceramic composition $A^{p+}_x(B'^{q+}_y B''^{r+}_{1-y})_z O^{2-}_w$ satisfies $w=0.5\times(p\times x+(q\times y+r\times(1-y))\times z)$ and $0 \leq y \leq 1$. Further, the ordered structure of the dielectric ceramic composition is formed from y: (1−y) arrangement over the B-site of the dielectric composition.

Preferably, there is designed a complex perovskite composition $A^{2+}(B'^{2+}_{1/3}B''^{5+}_{2/3})O^{2-}_3$.

Other objectives, constructions, and advantages of the present invention will be described in more detail by reference to the accompanying drawings. Needless to say, the scope of the present invention is not limited to illustrated embodiments.

BRIEF DESCRIPTION OF THE DRAWINGS

FIG. 2 is a schematic representation showing the arrangement of B' ions and B" ions which constitute a B-site shown in FIG. 1.

Figure 3:
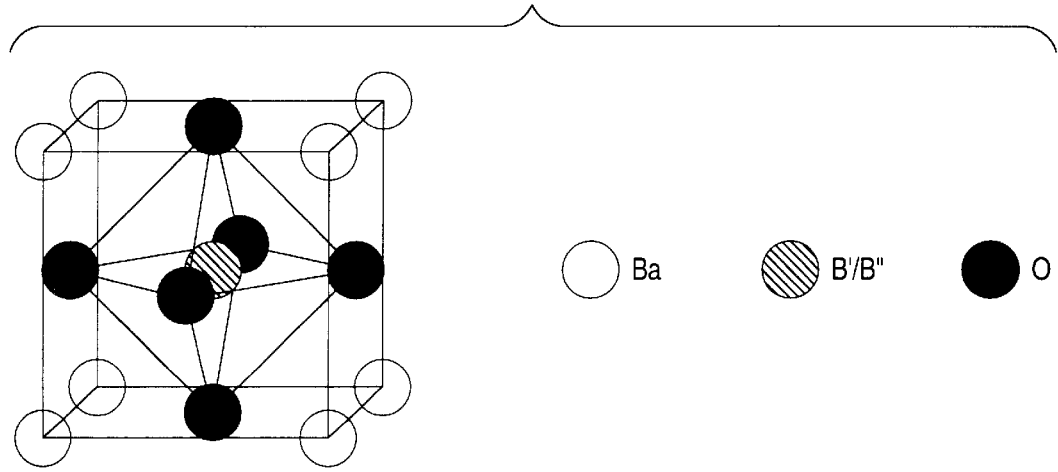
FIG. 3 is a schematic representation of a complex perovskite dielectric ceramic composition, showing a simple perovskite structure with a B-site disordered configuration.

A dielectric ceramic composition according to the present invention comprises 12-coordination A ions having a valence of +2; 6-coordination B' ions having a valence of +2; 6-coordination B" ions having a valence of +5; and 2-coordination O ions having a valence of −2. The dielectric ceramic composition has a superlattice structure which is based on a composite perovskite dielectric ceramic composition $A^{2+}(B'^{2+}_{1/3}B''^{5+}_{2/3})O^{2-}_3$. In a case where B' ions and B" ions are disordered over the B-site of the composite perovskite composite dielectric ceramic composition, a crystal structure shown in FIG. 3 is formed. This crystal structure is called a simple perovskite structure and corresponds to a $P_{m3m}(O^1_h)$ space group.

Figure 1:
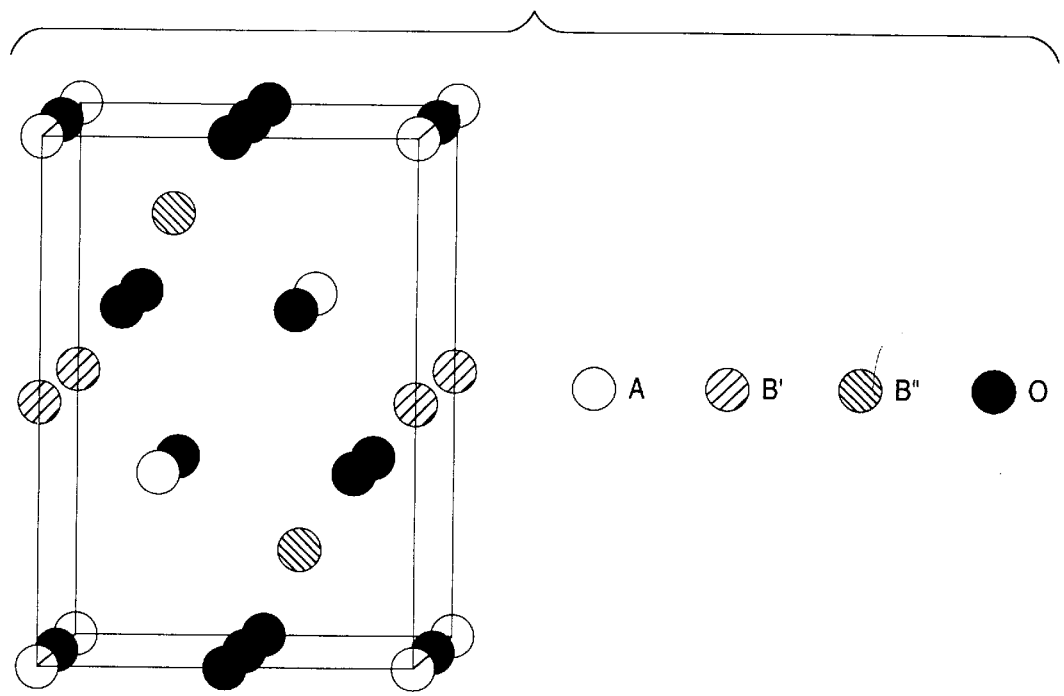
FIG. 1 is a schematic representation showing a hexagonal triple superlattice structure of a dielectric ceramic composition according to the present invention.
Figure 2:
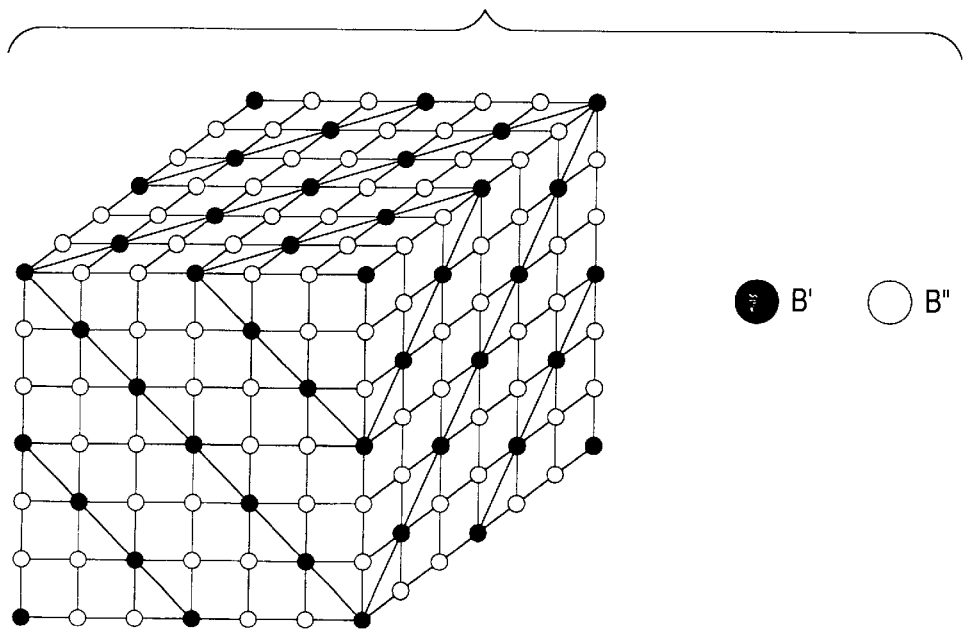
FIG. 2 is a schematic representation of a B-site shown in FIG. 1, in which B' ions and B" ions are arranged in a 1 to 2 ratio.

As shown in FIG. 2, in a case where $B'^{2+}$ ions and $B''^{5+}$ ions are ordered in the 1:2 B-site sequence along the [111] direction of the simple complex perovskite dielectric ceramic composition, there is formed a hexagonal triple superlattice structure. The structure has a $P\bar{3}m1(D_{3d}^3)$ space group. The triple superlattice structure of a dielectric ceramic composition shown in FIG. 1 is a crystal structure of a dielectric ceramic composition according to the present invention. Unless Q-factor remains substantially undeteriorated, the dielectric ceramic composition according to the present invention which is based on the superlattice structure may contain a disordered crystal phase or another impurity phase. Preferably, such heterogenous phase is controlled to 10 wt % or less. Further, the dielectric ceramic composition are principally formed from a total of four types of elements: that is, A ions having a valence of +2; B' ions having a valence of +2; B" ions having a valence of +5, and O ions having a valence of −2. Unless Q-factor remains substantially undeteriorated, ions may be formed from a plurality of elements. Each ion site may contain elements having a valence other than that specified. Moreover, A ions having a valence of +2 and B' ions having a valence of +2 may correspond to a single same element.

There are calculated the lattice energy of a hexagonal triple superlattice structure corresponding to a B-site ordered arrangement and that of a B-site disordered structure or that of a model structure analogous to a disordered structure. At the time of calculation, a crystal structure is optimized by means of a molecular design calculation, wherewith the lattice energy of the crystal structure is determined. The lattice energy is used after having been converted to energy per unit atom.

The optimum crystal structure corresponds to a crystal structure in which lattice energy possesses the minimum value. A preferable molecular design calculation is implemented by a simulation using the first principles method, the DV-$X_\alpha$ method, the molecular orbital method, a molecular dynamics method, a potential method and calculation of a disordered structure is ideal. Though performing a model structure approximated to a disordered structure may be used as an object of calculation in stead of the disordered structure. Simulation of a disordered structure usually encounters difficulty in terms of computation capability or time. Therefore, in some cases, use of an approximated model may be desirable.

A difference between the lattice energy $E_{ORD}$ per unit atom of the hexagonal triple superlattice structure and the lattice energy $E_{DIS}$ per unit atom of a disordered structure or a model structure approximated to a disordered configuration; that is, $\Delta E_{DIS-ORD}$, satisfies the following equation.

$$\Delta E_{DIS-ORD} E_{DIS} - E_{ORD} \geq 77.8 (meV/\text{atom}) \quad (1)$$

Such a dielectric ceramic composition is an object of the present invention.

Figure 4:
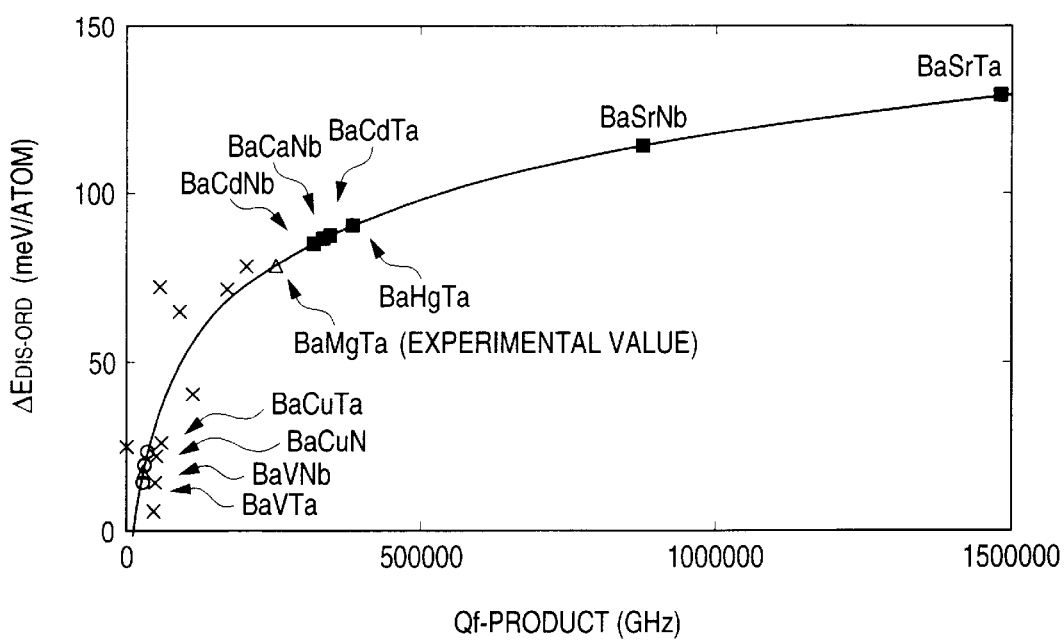
FIG. 4 is a graph showing a correlation between a lattice energy difference $\Delta E_{DIS-ORD}$ and Qf in connection with a dielectric ceramic composition having a high Q-factor in a high-frequency range which is newly designed by the present invention and in connection with conventional high-frequency dielectric ceramic composition.

Eq. (1) has been derived by the present inventor through considerable studies. Through computation of $\Delta E_{DIS-ORD}$ of an existing high-frequency dielectric ceramic composition, the present inventor has found a strong correlation between the lattice energy difference $\Delta E_{DIS-ORD}$ and Qf, as shown in FIG. 4. The correlation between $\Delta E_{DIS-ORD}$ and Qf is expressed by $$Qf(\text{GHz}) = k\exp\left(\frac{\Delta E_{DIS-ORD}}{k''}\right), \quad (2)$$

where k and k" are parameters depends on a crystal structure. In the present embodiment, k=15801.3 and k"=28.3.

In association with an increase of the operation frequency, conventional dielectric ceramic compositions encounter difficulty in achieving practical Q-factors in required frequency bands. In the case of the conventional dielectric ceramic compositions described in Table 1 and FIG. 4, $\Delta E_{DIS-ORD}$ can attain only a value of less than 77.8 (meV/atom). Accordingly, a dielectric ceramic composition can possess a maximum Qf of about 200000 (GHz).

Such a problem can be easily solved by means of designing a new dielectric ceramic composition capable of satisfying the correlation defined by Eq. (1). The present inventor has already found dielectric ceramic compositions satisfying Eq. (1), and these compositions will be described in detail by reference to the following examples.

EXAMPLES

The present invention will be described in more detail hereinbelow, by reference to a preferred embodiment.

Chemically high purity barium carbonate powder ($BaCo_3$), magnesium oxide powder (MgO), and tantalum oxide powder ($Ta_2O_5$) were used as starting materials. These powders were weighed so as to attain a mole ratio of Ba:Mg:Ta=3:1:2. The thus-weighed powders were subjected to wet blending through use of a ball mill. The resultant mixture was dried and subjected to calcination for two hours at a temperature of 1000° C. The thus-calcined mixture was subjected to wet pulverization for 30 hours through use of a ball mill, and an appropriate amount of polyvinyl alcohol was added to the thus-pulverized mixture, thereby forming granulates. The granulates were formed into a disk having a diameter of 12 mm and a thickness of 7 mm with a pressure of $9.8 \times 10^7$ $N/m^2$. The disk was sintered for 10 hours at 1650° C., whereby a ceramic sample was produced.

The ceramic sample was processed with the dimensions of a diameter of 10 mm and a thickness of 5 mm. The dielectric property of the ceramic sample was evaluated by a dielectric resonator rod method. As a result, there were measured as a dielectric constant $\in_r$ of 24 and a Q-factor of 29800 at 8.4 GHz. This result is plotted in FIG. 4, along with other evaluation results. The result sufficiently satisfies the relationship (2) between $\Delta E_{DIS-ORD}$ and Qf, and hence the effectiveness of the correlation is verified.

The dielectric ceramic composition according to the embodiment of the present invention is formed from 12-coordination Ba ions having a valence of +2; 6-coordination Hg ions having a valence of +2; 6-coordination Ta ions having a valence of +5, and 2-coordination O ions having a valence of –2. The dielectric ceramic composition is based on a complex perovskite dielectric ceramic composition $Ba^{2+}(Hg^{2+}_{1/3}Ta^{5+}_{2/3})O^{2+}_3$.

In connection with a model structure approximated to a disordered structure with $P_{m3m}(O^1_n)$ space group and a hexagonal triple superlattice with $P\bar{3}m1(D_{3d}^3)$ an optimal crystal structure was calculated through use of the first-principles methods. Calculation was performed through use of ultra-soft pseudopotentials and a plane wave basis set, and the Kohn-Sham equations were solved within a density functional method [i.e., local density approximation (LDA)].

A nine fold superlattice structure was used as an approximated disordered model structure. Various configurations of Hg and Ta ions over the B-sites were geometrically described for the complex perovskite structure. Then, a crystal structure whose B-site gives best possible approximation to a disordered structure was extracted and this nine fold superlattice structure was selected for the calculations.

Simulation of two structures which are objects of calculation was performed such that lattice energy is minimized. As a result, there were obtained optimum crystal structures. Table 2 shows atomic coordinates (x, y, z) of respective elements, lattice constants "a," "b," and "c," of respective axes, and crystal angles "α," "β," and "γ" in connection with ordered structures. Table 3 shows the same in connection with disordered model structures.

TABLE 2

| Element | Atomic Coordinates | | |
|---|---|---|---|
| | x | y | z |
| Ba | 0.000 | 0.000 | 0.000 |
| Ba | 0.333 | 0.667 | 0.660 |
| Ba | 0.667 | 0.333 | 0.340 |
| Hg | 0.000 | 0.000 | 0.500 |
| Ta | 0.667 | 0.333 | 0.837 |
| Ta | 0.333 | 0.667 | 0.163 |
| O | 0.500 | 0.000 | 0.000 |
| O | 0.822 | 0.645 | 0.692 |
| O | 0.178 | 0.355 | 0.308 |
| O | 0.000 | 0.500 | 0.000 |
| O | 0.355 | 0.178 | 0.692 |
| O | 0.645 | 0.822 | 0.308 |
| O | 0.822 | 0.178 | 0.692 |
| O | 0.178 | 0.822 | 0.308 |
| O | 0.500 | 0.500 | 0.000 | a = 5.851 (Å)  α = 90.0°
b = 5.851 (Å)  β = 90.0°
c = 7.290 (Å)  γ = 120.0°

TABLE 3

| Element | Atomic Coordinates | | |
|---|---|---|---|
| | x | y | z |
| Ba | 0.001 | 0.997 | 0.001 |
| Ba | 0.993 | 0.021 | 0.333 |
| Ba | 0.998 | 0.006 | 0.665 |
| Ba | 0.329 | 0.012 | 0.011 |
| Ba | 0.327 | 0.020 | 0.325 |
| Ba | 0.337 | 0.990 | 0.655 |
| Ba | 0.671 | 0.988 | 0.010 |
| Ba | 0.679 | 0.962 | 0.327 |
| Ba | 0.667 | 0.000 | 0.665 |
| Hg | 0.838 | 0.485 | 0.162 |
| Hg | 0.833 | 0.500 | 0.505 |
| Hg | 0.162 | 0.515 | 0.167 |
| Ta | 0.835 | 0.498 | 0.829 |
| Ta | 0.162 | 0.514 | 0.503 |
| Ta | 0.168 | 0.495 | 0.828 |
| Ta | 0.502 | 0.493 | 0.167 |
| Ta | 0.505 | 0.485 | 0.493 |
| Ta | 0.502 | 0.495 | 0.831 |
| O | 0.835 | 0.496 | 0.977 |
| O | 0.839 | 0.484 | 0.341 |
| O | 0.836 | 0.491 | 0.677 |
| O | 0.162 | 0.515 | 0.974 |
| O | 0.152 | 0.534 | 0.356 |
| O | 0.155 | 0.538 | 0.672 |
| O | 0.501 | 0.497 | 0.922 |
| O | 0.506 | 0.481 | 0.335 |
| O | 0.503 | 0.490 | 0.670 |
| O | 0.198 | 0.950 | 0.162 |
| O | 0.207 | 0.928 | 0.510 |
| O | 0.169 | 0.996 | 0.830 |
| O | 0.496 | 0.004 | 0.165 |
| O | 0.463 | 0.067 | 0.515 |
| O | 0.497 | 0.004 | 0.824 |
| O | 0.809 | 0.039 | 0.160 |
| O | 0.827 | 0.008 | 0.512 |
| O | 0.828 | 0.007 | 0.831 |
| O | 0.654 | 0.495 | 0.162 |
| O | 0.658 | 0.477 | 0.510 |
| O | 0.667 | 0.498 | 0.830 |
| O | 0.003 | 0.498 | 0.165 |
| O | 0.008 | 0.521 | 0.515 |
| O | 0.003 | 0.498 | 0.824 |

TABLE 3-continued

| | Atomic Coordinates | | |
|---------|-------|-------|-------|
| Element | x | y | z |
| O | 0.343 | 0.505 | 0.160 |
| O | 0.337 | 0.498 | 0.512 |
| O | 0.336 | 0.499 | 0.831 | a = 12.492 (Å) α = 90.0°
b = 9.364 (Å) β = 90.0°
c = 12.489 (Å) γ = 26.4°

From results of calculations of lattice energy per unit atom, the difference between two structures is determined as $$\Delta E_{DIS-ORD} = E_{DIS} - E_{ORD} = -8271.6 - (-8361.8) = 90.2 > 77.8 \text{ (meV/atom)} \quad (5)$$

There could be designed a novel dielectric ceramic composition $Ba^{2+}(Hg^{2+}_{1/3}Ta^{5+}_{2/3})O^{2-}_{3}$ which shows a Q-factor as high as Qf=390000 or thereabouts in a high frequency range.

In the present embodiment, a novel composition can be designed with a shorter period of development time and at lower cost, without involvement of composition development tests which would involve changes in an enormous number of combinations of elements and comsumption of much time and effort.

FIG. 4 summarizes other embodiments of the present invention. A total of six new dielectric ceramic compositions having very high Q-factors in a high-frequency range are introduced through use of the molecular design calculation which is the same as that described previously; specifically, $Ba^{2+}(Cd^{2+}_{1/3}Nb^{5+}_{2/3})O^{2-}_{3}: \Delta E=84.9(meV/atom), Qf=317000(GHz)$ $Ba^{2+}(Cd^{2+}_{1/3}Ta^{5+}_{2/3})O^{2-}_{3}: \Delta E=87.1(meV/atom), Qf=343000(GHz)$ $Ba^{2+}(Sr^{2+}_{1/3}Nb^{5+}_{2/3})O^{2-}_{3}: \Delta E=113.7(meV/atom), Qf=877000(GHz)$ $Ba^{2+}(Sr^{2-}_{1/3}Ta^{5+}_{2/3})O^{2-}_{3}: \Delta E=128.5(meV/atom), Qf=1481000(GHz)$ $Ba^{2+}(Ca^{2-}_{1/3}Nb^{5+}_{2/3})O^{2-}_{3}: \Delta E=86.3(meV/atom), Qf=333000(GHz)$ $Ba^{2+}(Hg^{2+}_{1/3}Ta^{5+}_{2/3})O^{2-}_{3}$ As one embodiment of the design method according to the present invention, in connection with $Ba^{2+}(C^{2+}_{1/3}Nb^{5-}_{2/3})O^{2-}_{3}$, $Ba^{2+}(Cu^{2+}_{1/3}Ta^{5+}_{2/3})O^{2-}_{3}$, $Ba^{2+}(V^{2+}_{1/3\ Nb}{}^{5+}_{2/3})O^{2-}_{3}$, a crystal structure having the B-site ordered configuration and a model structure approximated to a B-site disordered configuration are optimized such that these structures attain minimum lattice energy. As a result, there is determined an absolute value of a difference between the lattice energy $E_{ORD}$ per unit atom of the thus-optimized ordered crystal structure and the lattice energy $E_{DIS}$ per unit atom of the thus-optimized disordered model structure; that is, $|\Delta E_{DIS-ORD}|$. The thus-calculated value is also summarized in FIG. 4.

As has been described above, the present invention can provide a dielectric ceramic composition suitable for achieving a high Q-factor in a high frequency range. Further, the present invention can provide a design method for newly developing, at lower cost and within a short period of time, a dielectric ceramic composition having a high Q-factor in a high frequency range.

What is claimed is:

1. A method of designing a dielectric ceramic composition formed primarily from a complex perovskite dielectric ceramic composition $A_x^{p+}(B_y^{'q+}B_{1-y}^{''r+})_z O_w^{2-}$, which satisfies w=0.5×x×(p×y+r×(1-y))×z and 0≤y≤1, and having a hexagonal triple superlattice structure, comprising:

calculating a minimized lattice energy $E_{ORD}$ per unit atom of an optimized ordered configuration of a crystal structure of the dielectric ceramic composition;

calculating a minimized lattice energy $E_{DIS}$ per unit atom of an optimized disordered crystal structure of the dielectric ceramic composition or of an optimized model structure of the disordered crystal structure;

calculating an absolute value of a difference between the lattice energy $E_{ORD}$ per unit atom of the optimized ordered configuration of the crystal structure and the lattice energy $E_{DIS}$ per unit atom of the optimized disordered configuration of the crystal structure or the optimized model structure of a disordered configuration of a crystal structure of the dielectric ceramic composition; wherein said difference is represented by the expression $|\Delta E_{DIS-ORD}|$; and designing a dielectric ceramic composition having a $|\Delta E_{DIS-ORD}| \geq 77.8$ (meV/atom).

2. The method as defined in claim 1, wherein the designed dielectric ceramic composition is formed primarily from a complex perovskite composition of a formula $A^{2+}(B_{1/3}^{'2+}B_{2/3}^{''5+})O_3^{2-}$.

3. A method according to claim 1, wherein the complex perovskite composition is at least one member selected from the group consisting of $Ba(Cd_{1/3}Nb_{2/3})O_3$, $Ba(Cd_{1/3}Ta_{2/3})O_3$, $Ba(Sr_{1/3}Nb_{2/3})O_3$, $Ba(Sr_{1/3}Ta_{2/3})O_3$, $Ba(Ca_{1/3}Nb_{2/3})O_3$, a $Ba(Hg_{1/3}Ta_{2/3})O_3$, and mixtures thereof.

4. A method according to claim 1, wherein the complex perovskite composition is $Ba(Cd_{1/3}Nb_{2/3})O_3$.

5. A method according to claim 1, wherein the complex perovskite composition is $Ba(Cd_{1/3}Ta_{2/3})O_3$.

6. A method according to claim 1, wherein the complex perovskite composition is $Ba(Sr_{1/3}Nb_{2/3})O_3$.

7. A method according to claim 1, wherein the complex perovskite composition is $Ba(Sr_{1/3}Ta_{2/3})O_3$.

8. A method according to claim 1, wherein the complex perovskite composition is $Ba(Ca_{1/3}Nb_{2/3})O_3$.

9. A method according to claim 1, wherein the complex perovskite composition is $Ba(Hg_{1/3}Ta_{2/3})O_3$.

10. The method as defined in claim 1, wherein the ordered structure of the dielectric ceramic composition is formed from a y:(1-y) arrangement over a B-site of the dielectric composition.

11. The method as defined in claim 10, wherein the designed dielectric ceramic composition is formed primarily from a complex perovskite composition of a formula $A^{2+}(B_{1/3}^{'2+}B_{2/3}^{''5+})O_3^{2-}$.

12. A method according to claim 10, wherein the complex perovskite composition is at least one member selected from the group consisting of $Ba(Cd_{1/3}Nb_{2/3})O_3$, $Ba(Cd_{1/3}Ta_{2/3})O_3$, $Ba(Sr_{1/3}Nb_{2/3})O_3$, $Ba(Sr_{1/3}Ta_{2/3})O_3$, $Ba(Ca_{1/3}Nb_{2/3})O_3$, a $Ba(Hg_{1/3}Ta_{2/3})O_3$, and mixtures thereof.

13. A method according to claim 10, wherein the complex perovskite composition is $Ba(Cd_{1/3}Nb_{2/3})O_3$.

14. A method according to claim 10, wherein the complex perovskite composition is $Ba(Cd_{1/3}Ta_{2/3})O_3$.

15. A method according to claim 10, wherein the complex perovskite composition is $Ba(Sr_{1/3}Nb_{2/3})O_3$.

16. A method according to claim 10, wherein the complex perovskite composition is $Ba(Sr_{1/3}Ta_{2/3})O_3$.

17. A method according to claim 10, wherein the complex perovskite composition is $Ba(Ca_{1/3}Nb_{2/3})O_3$.

18. A method according to claim 10, wherein the complex perovskite composition is $Ba(Hg_{1/3}Ta_{2/3})O_3$.

* * * * *